United States Patent
Zhang

(10) Patent No.: US 11,862,225 B2
(45) Date of Patent: Jan. 2, 2024

(54) COMPARISON CIRCUIT AND MEMORY

(71) Applicant: CHANGXIN MEMORY TECHNOLOGIES, INC., Hefei (CN)

(72) Inventor: Zhiqiang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/660,411

(22) Filed: Apr. 24, 2022

(65) Prior Publication Data

US 2022/0375506 A1    Nov. 24, 2022

(30) Foreign Application Priority Data

May 20, 2021    (CN) .......................... 202110553958.3

(51) Int. Cl.
    *G11C 11/4072*    (2006.01)
(52) U.S. Cl.
    CPC ................................ *G11C 11/4072* (2013.01)
(58) Field of Classification Search
    CPC ............ G11C 11/4072; G11C 11/4093; G11C 29/022; G11C 29/028; G11C 29/50008; G11C 7/1084
    See application file for complete search history.

(56) References Cited

U.S. PATENT DOCUMENTS

| 2010/0195415 | A1* | 8/2010 | Seko | .......................... G11C 7/02 365/207 |
| 2010/0271092 | A1* | 10/2010 | Zerbe | ................... G11C 7/1093 327/161 |
| 2023/0019429 | A1* | 1/2023 | Zhang | ................... G11C 29/028 |

FOREIGN PATENT DOCUMENTS

| CN | 205945656 U | 2/2017 |
| CN | 114204939 A | 3/2022 |

* cited by examiner

*Primary Examiner* — Sultana Begum
(74) *Attorney, Agent, or Firm* — Syncoda LLC; Feng Ma

(57) ABSTRACT

A comparison circuit includes a reference adjustment module, a signal receiving module, and a control module. The reference adjustment module is configured to receive a first reference signal and output a second reference signal. The reference adjustment module is further configured to receive an adjustment signal, and unidirectionally adjust the equivalent coefficient within a preset value interval when the adjustment signal is received. The signal receiving module is configured to receive the second reference signal and an external signal. The control module is configured to: receive an enable signal and the comparison signal; and during a period of continuously receiving the enable signal, when the comparison signal jumps, terminate the output of the adjustment signal.

17 Claims, 3 Drawing Sheets

COMPARISON CIRCUIT AND MEMORY

CROSS-REFERENCE TO RELATED APPLICATION

The present application claims priority to Chinese Patent Application No. 202110553958.3 filed on May 20, 2021, the disclosure of which is hereby incorporated by reference in its entirety.

BACKGROUND

In a storage system, since an amplitude of a high-speed transmission signal is extremely limited, when a high-speed receiver for receiving the signal has an offset voltage, it may cause the high-speed receiver to make a wrong determination on an input signal, that is, it may cause an error in a comparison signal which represents the generation of determination result, as a result, it may in turn lead to an error in an internal action performed based on the comparison signal, and a data storage task cannot be effectively completed.

SUMMARY

Embodiments of the present disclosure relate to the field of semiconductors, and in particular, to a comparison circuit and a memory Embodiments of the present disclosure provide a comparison circuit and a memory.

To solve the above problem, the embodiments of the present disclosure provide a comparison circuit. The circuit includes a reference adjustment module, a signal receiving module, and a control module. The reference adjustment module is configured to receive a first reference signal and output a second reference signal, where a voltage value of the second reference signal is equal to a voltage value of the first reference signal multiplied by an equivalent coefficient. The reference adjustment module is further configured to receive an adjustment signal, and unidirectionally adjust the equivalent coefficient within a preset value interval when the adjustment signal is received. A minimum value in the preset value interval is less than 1 and a maximum value in the preset value interval is greater than 1. The signal receiving module is configured to receive the second reference signal and an external signal, and output a comparison signal. The second reference signal after experiencing a mismatch of the signal receiving module is equivalent to a third reference signal. When a voltage value of the external signal is greater than a voltage value of the third reference signal, a first comparison signal is output. When the voltage value of the external signal is smaller than the voltage value of the third reference signal, a second comparison signal is output. The control module is configured to: receive an enable signal and the comparison signal; and during a period of continuously receiving the enable signal, when one of the first comparison signal or the second comparison signal is received, output the adjustment signal; and when the received comparison signal jumps from one of the first comparison signal or the second comparison signal to the other, terminate the output of the adjustment signal.

In addition, the external signal may include the first reference signal or a data signal. When the enable signal is not received, the data signal is taken as the external signal. The comparison circuit may further include: a signal input module that is connected to an input terminal of the signal receiving module and configured to receive the enable signal and the first reference signal. During the period of continuously receiving the enable signal, the first reference signal is taken as the external signal.

Furthermore, the signal input module may include a first MOS transistor. A drain of the first MOS transistor may be configured to receive the first reference signal. A gate of the first MOS transistor may be configured to receive the enable signal. A source of the first MOS transistor may be connected to the first input terminal of the signal receiving module. The first input terminal of the signal receiving module may be further configured to receive the data signal. The second input terminal of the signal receiving module may be configured to receive the second reference signal.

Moreover, an enable terminal of the signal input module that is configured to receive the enable signal may be connected to an enable terminal of the control module that is configured to receive the enable signal.

Additionally, the reference adjustment module may include an operational amplifier and a plurality of series resistors. The operational amplifier may have a non-inverting input terminal, an inverting input terminal and an output terminal. The non-inverting input terminal may be configured to receive the first reference signal. A first number of resistors may be connected in series between the inverting input terminal and the output terminal. A second number of resistors may be connected in series between the inverting input terminal and a ground terminal. The operation that the equivalent coefficient is unidirectionally adjusted within the preset value interval may include: controlling an output terminal of the reference adjustment module to be connected to a far ground terminal of a resistor, in an order from the output terminal to the ground terminal, or in an order from the ground terminal to the output terminal.

In addition, the reference adjustment module may further include a plurality of switches. The plurality of switches may be located between a far ground terminal of each of the resistors and the output terminal of the reference adjustment module. The switches located between far ground terminals of the different resistors and the output terminal of the reference adjustment module may be different. The operation of controlling the output terminal of the reference adjustment module to be connected to the far ground terminal of the resistor may include: controlling one of the plurality of switches to be turned on.

Furthermore, the adjustment signal may be a trigger signal. The operation of controlling one of the plurality of switches to be turned on may include: controlling one of the plurality of switches to be turned on according to a preset unidirectional adjustment order.

Moreover, the control module may include a control unit and an enabling unit. The control unit may be configured to receive the comparison signal, when a voltage value of a current comparison signal is the same as a voltage value of a previous comparison signal, adjust parameters comprised in the adjustment signal in the preset unidirectional adjustment order, and output the adjustment signal after adjusting the parameter information; and when the voltage value of the current comparison signal is different from the voltage value of the previous comparison signal, store the parameter information comprised in the adjustment signal. The reference adjustment module may be further configured to take the parameter information comprised in the adjustment signal as the equivalent coefficient. The enabling unit may be configured to receive the enable signal, and enable the control unit during the period of continuously receiving the enable signal.

Additionally, the enabling unit may include a second MOS transistor. A drain of the second MOS transistor may be connected to an output terminal of the signal receiving module. A source of the second MOS transistor may be connected to an input terminal of the control unit, and a gate of the second MOS transistor may be configured to receive the enable signal.

Furthermore, the signal receiving module may include a signal amplifying unit and a data comparison unit. The signal amplifying unit may have a first input terminal that is configured to receive the external signal, a second input terminal that is configured to receive the second reference signal, a first output terminal that is configured to output a reference amplified signal, and a second output terminal that is configured to output an external amplified signal. An absolute value of a difference between the voltage values of the reference amplified signal and the external amplified signal may be greater than an absolute value of a difference between the voltage value of the second reference signal and the external signal. The non-inverting input terminal of the data comparison unit may be configured to receive the reference amplified signal. The inverting input terminal of the data comparison unit may be configured to receive the external amplified signal. The data comparison unit is configured to output the first comparison signal when the voltage value of the external amplified signal is greater than the voltage value of the reference amplified signal, output the second comparison signal when the voltage value of the external amplified signal is smaller than the voltage value of the reference amplified signal.

Moreover, the signal amplifying unit may include a differential amplifying circuit that is configured to receive the second reference signal and the external signal, and output the reference amplified signal and the external amplified signal.

In addition, the differential amplifying circuit may include a third MOS transistor and a fourth MOS transistor. Both of the third MOS transistor and the fourth MOS transistor are of the same type and size. A gate of the third MOS transistor may be configured to receive the second reference signal. A drain of the third MOS transistor may be configured to connect to a first load. A gate of the fourth MOS transistor may be configured to receive the external signal. A drain of the fourth MOS transistor may be configured to connect to a second load. A source of the third MOS transistor and a source of the fourth MOS transistor may be connected to the same current source.

Additionally, the first load and the second load may be resistors with the same resistance value.

Furthermore, the enable signal may be triggered by a ZQCL command in a DRAM circuit, and the duration of the enable signal may be equal to the duration of the ZQCL command.

Correspondingly, the embodiments of the present disclosure further provide a memory including the comparison circuit according to any one of the above.

BRIEF DESCRIPTION OF THE DRAWINGS

One or more embodiments are exemplified by the pictures in the accompanying drawings, which do not constitute a scale limitation unless otherwise stated.

DETAILED DESCRIPTION

In order to make the objectives, technical solutions and advantages of the embodiments of the present disclosure clearer, various embodiments of the present disclosure will be described in detail below with reference to the accompanying drawings. However, a person of ordinary skill in the art would appreciate that, in various embodiments of the present disclosure, many technical details are provided for the reader to better understand the present disclosure. However, even without these technical details and various changes and modifications based on the following embodiments, the technical solutions claimed in the present disclosure can be realized.

The offset voltage is mainly caused by a manufacturing process deviation of a functional device, and there may be one or more functional devices having the process deviation. Therefore, how to eliminate the offset voltage introduced by the process deviation has become a focus of current research.

Figure 1:
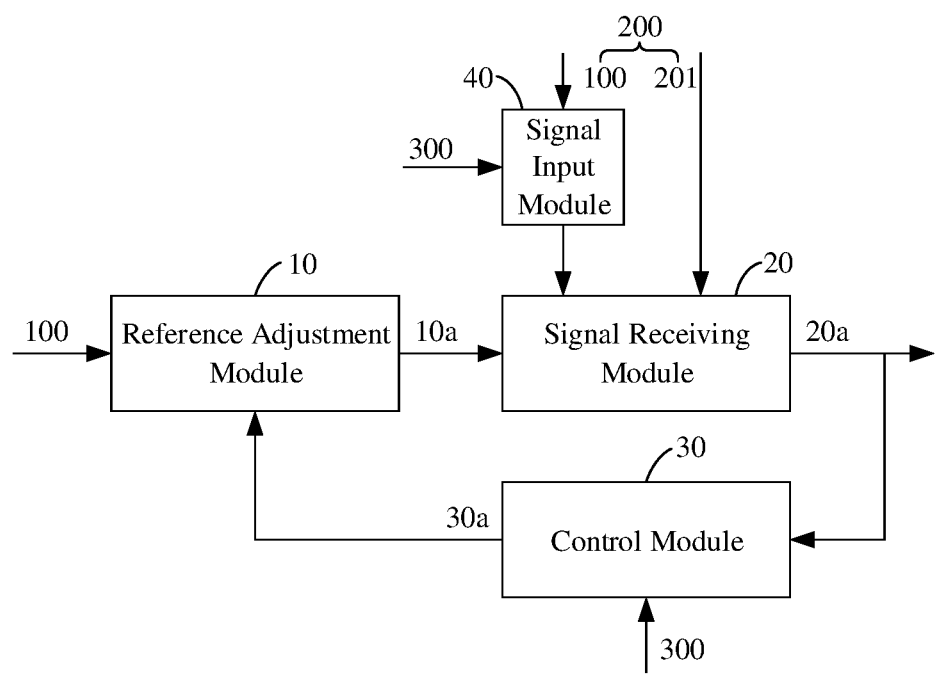
FIG. 1 illustrates a schematic structure diagram of a comparison circuit according to an embodiment of the present disclosure.

With reference to FIG. 1, a comparison circuit includes a reference adjustment module 10, a signal receiving module 20, and a control module 30. The reference adjustment module 10 is configured to receive a first reference signal 100 and output a second reference signal 10a. A voltage value of the second reference signal 10a is equal to a voltage value of the first reference signal 100 multiplied by an equivalent coefficient. The reference adjustment module 10 is further configured to: receive an adjustment signal 30a. and unidirectionally adjust the equivalent coefficient within a preset value interval when the adjustment signal 30a is received. A minimum value in the preset value interval is less than 1 and a maximum value in the preset value interval is greater than 1. The signal receiving module 20 is configured to receive the second reference signal 10a and an external signal 200, and output a comparison signal 20a. The second reference signal 10a after experiencing a mismatch of the signal receiving module 20 is equivalent to a third reference signal (not illustrated). When a voltage value of the external signal 200 is greater than a voltage value of the third reference signal, a first comparison signal is output. When the voltage value of the external signal 200 is smaller than the voltage value of the third reference signal, a second comparison signal is output. The control module 30 is configured to: receive an enable signal 300 and the comparison signal 20a; and during a period of continuously receiving the enable signal 300, when one of the first comparison signal or the second comparison signal is received, output the adjustment signal 30a; and when the received comparison signal 20a jumps from one of the first comparison signal or the second comparison signal to the other, terminate the output of the adjustment signal 30a.

In this embodiment, the signal receiving module 20 may have an offset voltage. The offset voltage comes from an inevitable deviation in the device manufacturing process. The existence of the offset voltage causes the comparison signal 20a to actually represent the magnitude relationship between the voltage values of the signal after mismatched and the external signal 200. If it is required that the comparison signal 20a represents the magnitude relationship between the voltage values of the first reference signal 100 and the external signal 200, it is necessary to offset the offset voltage by the setting of the equivalent coefficient, so that the voltage value of the third reference signal which has experienced the mismatch of the signal receiving module 20 is equal to the voltage value of the first reference signal 100. In this way, in an operation process of a DRAM circuit, the magnitude relationship between the voltage values of the external signal 200 and the first reference signal 100 can be determined by the type of the comparison signal 20*a*, specifically, by the voltage value of the comparison signal 20*a*.

The operation process of the DRAM circuit can be divided into an initialization phase, a reset phase and an operation phase. The DRAM circuit performs an operation phase after completing the initialization or reset. In the initialization and reset phases, the DRAM may receive a ZQCL command sent by a DRAM controller for ZQ calibration. In this phase, the ZQ calibration is mainly to calibrate the output driver and chip terminal circuit, specifically, to calibrate an output resistance and ODT resistance of the DRAM. The ZQ calibration in the initialization and reset phases takes a long time. in the operation phase, the DRAM can receive a ZQCS command sent by the DRAM controller to perform the ZQ calibration. In this phase, the ZQ calibration is mainly to calibrate voltage and temperature changes. The ZQ calibration in the operation phase takes a shorter time. During the ZQ calibration, the signal receiving module 20 in the DRAM circuit does not receive data signal 201. In the data writing phase of the operation phase, the signal receiving module 20 in the DRAM circuit starts to receive the data signal 201.

In this embodiment, an enable signal 300 is triggered by the ZQCL command received by the DRAM circuit. The duration of the enable signal 300 is equal to the duration of the ZQCL command. In this way, during the ZQ calibration period of the initialization and reset phases, the enable signal 300 is triggered, and the signal receiving module 20 receives the first reference signal 100. During the data writing phase, the enable signal 300 is terminated, and the signal receiving module 20 receives the written data signal 201. That is to say, a same port of the signal receiving module 20 can be used to receive the first reference signal 100 and the data signal 201 successively, that is, the external signal 200 can be set as the first reference signal 100 and the data signal 201 successively, so as to avoid the occurrence of a conflict between the reception of the first reference signal 100 and the reception of the data signal 201. In other words, no additional functional unit is required to be provided to adjust and control the sequential reception of the first reference signal 100 and the data signal 201, which is beneficial to simplify the comparison circuit and reduce the complexity of the comparison circuit.

The enable signal 300 is triggered by the ZQCL command received by the DRAM circuit, which can be understood as the enable signal 300 is triggered after the ZQCL command is received and a clock cycle has elapsed. The enable signal 300 can be either a high-level active signal or a low-level active signal. Accordingly, the enable signal 300 may be triggered by either jumping from a low level to a high level, or jumping from a high level to a low level.

The threshold value range of the preset value interval is related to physical characteristics of the signal receiving module 20. Specifically, the larger the offset voltage of the signal receiving module 20, the larger a maximum value or the smaller a minimum value in the preset value interval is and the greater the absolute value of the difference between the voltage value of the second reference signal 10*a* and the voltage value of the first reference signal 100 is. In this way, it is beneficial to make the voltage value interval of the third reference signal include the voltage value of the first reference signal 100, so that in the process of unidirectionally adjusting the equivalent coefficient, the voltage value of the third reference signal is determined according to the jump of the comparison signal 20*a* close to the voltage value of the first reference signal 100, and then the equivalent coefficient of the reference adjustment module 10 is determined to effectively compensate the offset voltage of the signal receiving module 20. After the offset voltage is compensated, the third reference signal is equivalent to the first reference signal, and the comparison signal 20*a* actually represents the magnitude relationship between the voltage values of the first reference signal 100 and the data signal 201. In the case where the voltage value of the first reference signal 100 is a fixed value, the voltage value of the data signal 201 can be determined according to the type of the comparison signal 20*a*.

In this embodiment, the external signal 200 includes the first reference signal 100 or a data signal 201. When the enable signal 300 is not received, the data signal 201 is taken as the external signal 200. the comparison circuit further includes a signal input module 40 that is connected to an input terminal of the signal receiving module 20 and configured to receive the enable signal 300 and the first reference signal 100. During the period of continuously receiving the enable signal 300, the first reference signal 100 is taken as the external signal 200.

Figure 2:
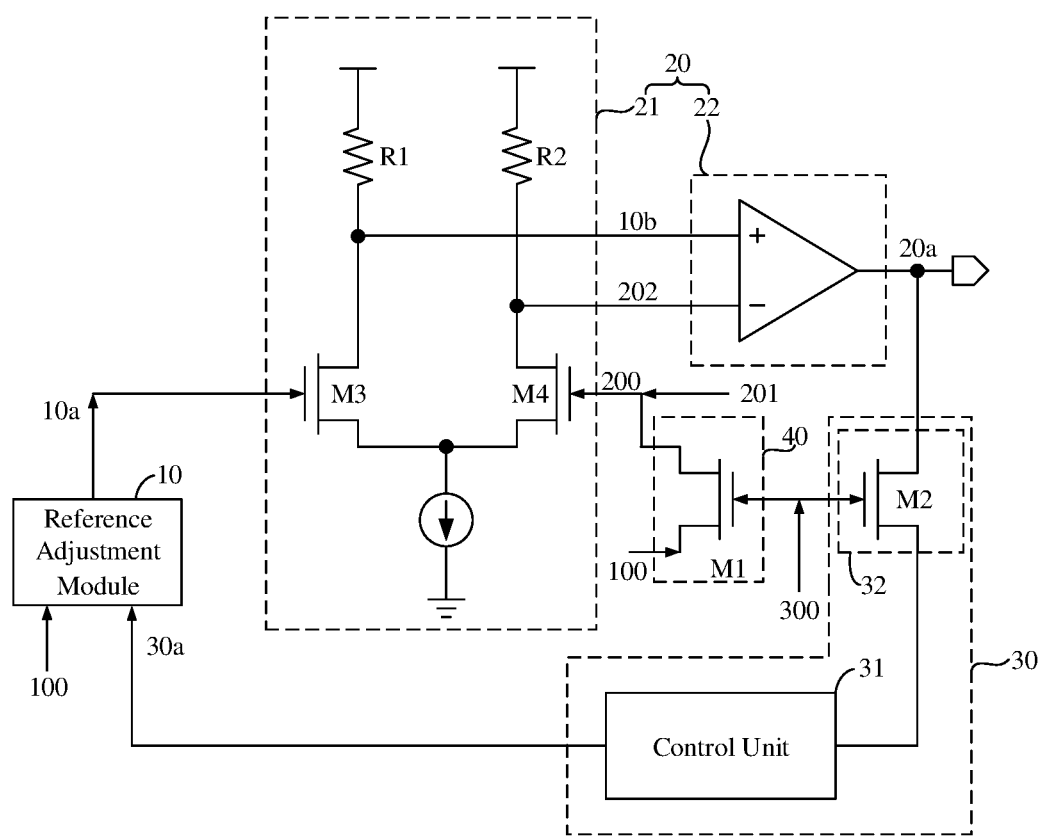
FIG. 2 illustrates another schematic structure diagram of the comparison circuit according to an embodiment of the present disclosure.

Specifically, with reference to FIG. 2, the signal input module 40 includes a first MOS transistor M1, a drain of the first MOS transistor M1 is configured to receive the first reference signal 100, a gate of the first MOS transistor M1 is configured to receive the enable signal 300, and a source of the first MOS transistor M1 is connected to a first input terminal of the signal receiving module 20. The first input terminal of the signal receiving module 20 is further configured to receive the data signal 201. A second input terminal of the signal receiving module 20 is configured to receive the second reference signal 10*a*. That is to say, during the ZQ calibration period, the enable signal 300 is triggered, the drain of the first MOS transistor M1 receives the first reference signal 100, the gate of the first MOS transistor M1 receives the enable signal 300, and the enable signal 300 controls the source and drain of the first MOS transistor M1 to be turned on, and the first reference signal 100 is input to the first input terminal of the signal receiving module 20 as an external signal 200. In the data writing phase, the drain of the first MOS transistor M1 receives the first reference signal 100, the source and drain of the first MOS transistor M1 are turned off, the first input terminal of the signal receiving module 20 receives the data signal 201, and the data signal 201 is input to the first input terminal of the signal receiving module 20 as the external signal 200.

Since both the signal input module and the control module 30 need to receive the enable signal 300, the enable terminal of the signal input module 40 that is used to receive the enable signal 300 can be connected to the enable terminal of the control module 30 that is used to receive the enable signal 300. When the signal input module 40 is the first MOS transistor M1, the gate of the first MOS transistor M1 is taken as the enable terminal of the signal input module 40, and the gate of the first MOS transistor M1 is connected to the enable terminal of the control module 30.

The first MOS transistor M1 can be either an NMOS transistor or a PMOS transistor. When the first MOS transistor M1 is an NMOS transistor, the enable signal 300 is a high-level active signal. When the first MOS transistor M1 is a PMOS transistor, the enable signal 300 is a low-level active signal.

Figure 3:
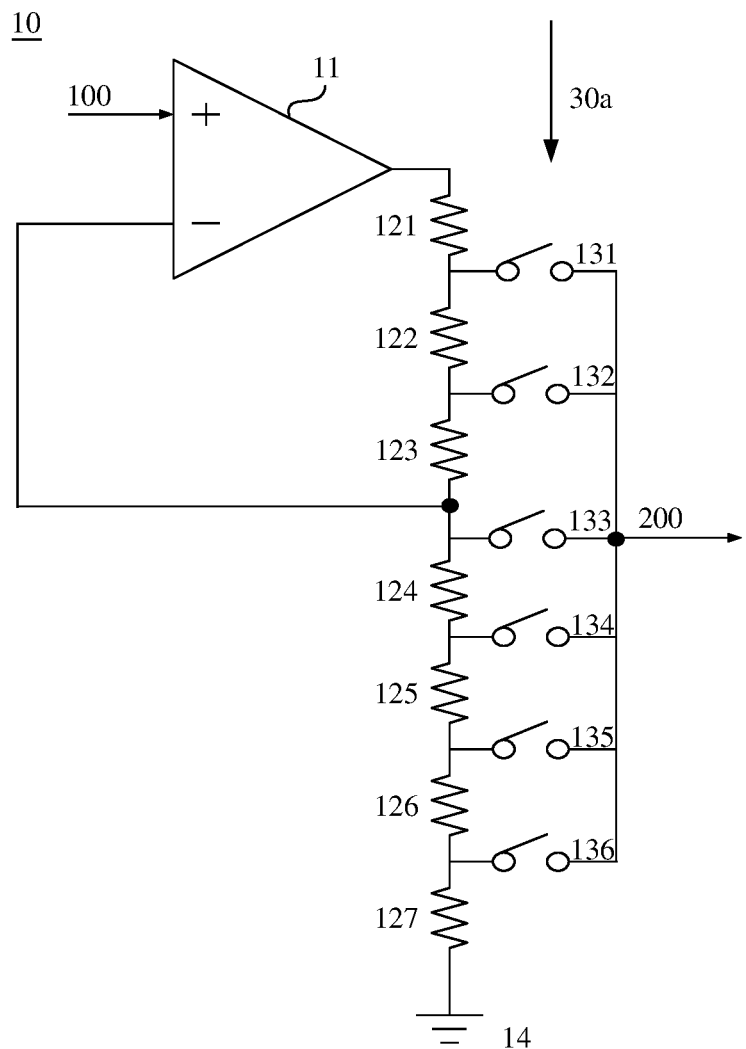
FIG. 3 illustrates a schematic structure diagram of a reference adjustment module in the comparison circuit illustrated in FIG. 1.

In this embodiment, with reference to FIG. 3, the reference adjustment module 10 includes an operational amplifier 11 and a plurality of series resistors. The operational amplifier 11 has a non-inverting input terminal, an inverting input terminal and an output terminal. The non-inverting input terminal is configured to receive the first reference signal 100. A first number of resistors are connected in series between the inverting input terminal and the output terminal. A second number of resistors are connected in series between the inverting input terminal and a ground terminal 14. The operation of unidirectionally adjust the equivalent coefficient within a preset value interval includes that: an output terminal of the reference adjustment module 10 is controlled to be connected to a far ground terminal of a resistor in an order from the output terminal of the operational amplifier 11 to the ground terminal, or from the ground terminal 14 to the output terminal of the operational amplifier 11.

Each resistor has a near ground terminal and a far ground terminal. According to the connection relationship between the resistor and the ground terminal 14, the near ground terminal is the terminal of the resistor close to the ground terminal 14, and the far ground terminal is the other terminal of the resistor away from the ground terminal 14. When the current flows through the resistor, the voltage at the far ground terminal is greater than the voltage at the near ground terminal. Exemplarily, in the order from the output terminal of the operational amplifier 11 to the ground terminal 14, a first resistor 121, a second resistor 122, a third resistor 123, a fourth resistor 124, a fifth resistor 125, a sixth resistor 126 and a seventh resistor 127 are sequentially connected in series between the output terminal of the operational amplifier 11 and the ground terminal 14. The ground terminal 14 is connected to the near ground terminal of the seventh resistor 127. The inverting input terminal of the operational amplifier 11 is connected to the near ground terminal of the third resistor 123 and the far ground terminal of the fourth resistor 124. The output terminal of the operational amplifier 11 is connected to the far ground terminal of the first resistor 121.

When the operational amplifier 11 receives the first reference signal 100, under the action of the operational amplifier 11, the voltage value of the output terminal of the operational amplifier 11 is greater than the voltage value of the first reference signal 100, and the voltage value of the inverting input terminal of the operational amplifier 11 is equal to the voltage value of the first reference signal 100. That is to say, in the order from the output terminal of the operational amplifier 11 to the ground terminal 14, the output terminal of the reference adjustment module 10 is controlled to be connected to the far ground terminal of a resistor, so that the voltage value of the reference adjustment module 10 at the output terminal is gradually changed from a voltage value greater than the first reference signal 100 to a voltage value smaller than the first reference signal 100, which is equivalent to the transition of the equivalent coefficient of the reference adjustment module 10 from a value greater than 1 to a value less than 1. In this way, no matter whether the mismatch of the signal receiving module 20 causes the voltage value of the third reference signal to be greater than the voltage value of the second reference signal 10a, or causes the voltage value of the third reference signal to be smaller than the voltage value of the second reference signal 10a, the mismatch of the signal receiving module 20 may be offset by adjusting the equivalent coefficient, so that the voltage value of the third reference signal is equal to the voltage value of the first reference signal 100, that is, the third reference signal is equivalent to the first reference signal 100.

In addition, by controlling the numerical values of the first number and the second number and the resistance value of the resistor, the voltage values of the far ground terminals of different resistors and the voltage value difference between the far ground terminals of different resistors can be adjusted so as to adjust the voltage threshold value range and change gradient at the output terminal of the reference adjustment module 10. When the threshold value range of the voltage value at the output terminal of the reference adjustment module 10 is larger and the change gradient is smaller, no matter whether the mismatched voltage of the signal receiving module 20 is large or small, by switching the far ground terminal of the resistor connected to the output terminal of the reference adjustment module 10, the equivalent coefficient of the reference adjustment module 10 offsets the mismatch of the signal receiving module 20, so that the third reference signal is equivalent to the first reference signal 100.

In this embodiment, the reference adjustment module 10 further includes a plurality of switches. The plurality of switches are located between the far ground terminal of each of the resistors and the output terminal of the reference adjustment module 10, the switches located between the far ground terminals of the different resistors and the output terminal of the reference adjustment module 10 are different. The operation of controlling an output terminal of the reference adjustment module 10 to be connected to a far ground terminal of a resistor include that: one of the plurality of switches is controlled to be turned on. Exemplarily, the reference adjustment module 10 includes a first switch 131, a second switch 132, a third switch 133, a fourth switch 134, a fifth switch 135 and a sixth switch 136. The first switch 131 is connected to the far ground terminal of the second resistor 122, the second switch 132 is connected to the far ground terminal of the third resistor 123, the third switch 133 is connected to the far ground terminal of the fourth resistor 124, and the fourth switch 134 is connected to the far ground terminal of the fifth resistor 125, the fifth switch 135 is connected to the far ground terminal of the sixth resistor 126, and the sixth switch 136 is connected to the far ground terminal of the seventh resistor 127.

In this embodiment, the control module 30 includes a control unit 31, the reference adjustment module 10, and an enabling unit 32. The control unit 31 is configured to: receive the comparison signal 20a; when a voltage value of the current comparison signal 20a is the same as a voltage value of the previous comparison signal 20a, adjust the parameters of the adjustment signal 30a according to the preset unidirectional adjustment order, and output the adjustment signal 30a after adjusting the parameter information; and when the voltage value of the current comparison signal 20a is different from the voltage value of the previous comparison signal 20a, store the parameter information of the adjustment signal 30a. The reference adjustment module 10 is further configured to take the parameter information included in the adjustment signal 30a as the equivalent coefficient. The enabling unit 32 is configured to receive the enable signal 300, and enable the control unit 31 during the period of continuously receiving the enable signal 300.

The enabled control unit 31 is configured to eliminate the offset according to the comparison signal 20a, i.e., to adjust the equivalent coefficient of the reference adjustment module 10. When the voltage value of the current comparison signal 20*a* is different from the voltage value of the previous comparison signal 20*a*, the control unit 31 no longer sends the adjustment signal 30*a*. That is, the equivalent coefficient of the reference adjustment module 10 is determined. Based on the determined equivalent coefficient, in the subsequent data writing phase, the input first reference voltage is equivalent to the second reference voltage through the reference adjustment module 10.

Since the voltage value of the signal may fluctuate due to environmental influences, the voltage values of the comparison signal 20*a* are the same, which actually means that the difference between the voltage values of the different comparison signals 20*a* is smaller than a first preset value. Accordingly, the voltage values of the different comparison signals are different, which actually means that the difference between the voltage values of the different comparison signals 20*a* is greater than a second preset value. The first preset value is a maximum allowable error value set according to actual needs. The second preset value is a minimum change value set according to actual needs. In addition, the parameter information of the adjustment signal 30*a* stored by the control unit 31 can be used to set other reference adjustment modules to offset the mismatch of other similar signal receiving devices. In addition, it is also possible to adjust the equivalent coefficient of the reference adjustment module 10 within a small threshold value range with the stored parameter information as a center after the signal receiving module 20 is subjected to the interference which may affect the performance, without adjusting the equivalent coefficient from the extreme value in the maximum threshold value range of the equivalent coefficient. In this way, it is beneficial to shorten the adjustment time of the reference adjustment module 10, thereby quickly offsetting the mismatch of the signal receiving module 20, and to avoid the adjustment time of the reference adjustment module 10 exceeding the initialization time of the DRAM circuit, that is, to avoid the occurrence of a conflict between the adjustment of the equivalent coefficient and the reception of the data signal 201 to ensure the effective operation of the comparison circuit.

In this embodiment, the parameter information includes turn-on information of the switches, which represents which switch in the plurality of switches is to be turned on. Specifically, the parameter information is code<N:0>, code<N:0> is a binary number of N+1 bits, the maximum value of N+1 is equal to the number of switches, which bit in code<N:0> is high level means that the corresponding switch is turned on, and the remaining switches are turned off. Exemplarily, there are 6 switches in total, and the parameter information code<5:0>=001000, at this time, the fourth switch 134 is turned on, the remaining switches are turned off, and the voltage of the reference adjustment module 10 at the output terminal is the same as the voltage of the fifth resistor 125 at the far ground terminal. Correspondingly, the above adjustment of the parameter information of the adjustment signal 30*a* according to the preset unidirectional adjustment order refers to the adjustment of the parameter information code<N:0> according to the unidirectional adjustment order, so that the parameter values of different digits are sequentially 1, so that the corresponding switch is sequentially opened until the comparison signal 20*a* jumps.

In this embodiment, the enabling unit 32 includes a second MOS transistor M2. A drain of the second MOS transistor M2 is connected to the output terminal of the signal receiving module 20. A source of the second MOS transistor M2 is connected to the input terminal of the control unit 31. A gate of the second MOS transistor M2 is configured to receive the enable signal 300. When the second MOS transistor M2 is turned on, the control unit 31 receives the comparison signal 20*a*, and then outputs adjustment signal 30*a* or terminates the output of the adjustment signal 30*a* according to the currently received comparison signal 20*a* and the previously received comparison signal 20*a*. When the second MOS transistor M2 is turned off, the control unit 31 cannot receive the comparison signal 20*a*, and the control unit 31 suspends operation.

The second MOS transistor M2 can be either an NMOS transistor or a PMOS transistor. When the gate of the first MOS transistor M1 is electrically connected to the gate of the second MOS transistor M2, the first MOS transistor M1 is of the same type as the second MOS transistor M2. When the first MOS transistor M1 and the second MOS transistor M2 are independent of each other, the types of the first MOS transistor M1 and the second MOS transistor M2 may be the same or different.

In this embodiment, the adjustment signal 30*a* includes parameter information, and the reference adjustment module 10 takes the parameter information in the adjustment signal 30*a* as an equivalent coefficient. In other embodiments, the adjustment signal is a trigger signal that controls one of the plurality of switches to be turned on, which includes: controlling one of the plurality of switches to be turned on according to a preset unidirectional adjustment order. For example, each time an adjustment signal is received, the position of the turned-on switch is incremented by one bit. Specifically, at first, the fifth switch is turned on, and the other switches are turned off. After receiving an adjustment signal, the fourth switch is turned on, and the fifth switch is turned off, After receiving another adjustment signal, the third switch is turned on, and the fourth switch is turned off; and so repeat . . . .

In this embodiment, the signal receiving module 20 includes a signal amplifying unit 21 and a data comparison unit 22. The signal amplifying unit 21 has a first input terminal that is configured to receive the external signal 200, a second input terminal that is configured to receive the second reference signal 10*a*, a first output terminal that is configured to output a reference amplified signal 10*b*, and a second output terminal that is configured to output an external amplified signal 202. The absolute value of the difference between the voltage values of the reference amplified signal 10*b* and the external amplified signal 202 is greater than the absolute value of the difference between the voltage values of the second reference signal 10*a* and the external signal 200. The non-inverting input terminal of the data comparison unit 22 is configured to receive the reference amplified signal 10*b*, and the inverting input terminal of the data comparison unit 22 is configured to receive the external amplified signal 202. The data comparison unit is further configured to output the first comparison signal when the voltage value of the external amplified signal 202 is greater than the voltage value of the reference amplified signal 10*b*, and output the second comparison signal when the voltage value of the external amplified signal 202 is smaller than the voltage value of the reference amplified signal 10*b*.

By amplifying the voltage value difference between the second reference signal 10*a* and the external signal 200 before comparing the second reference signal 10*a* and the external signal 200, the accuracy of the comparison result of the data comparison unit 22 can be improved. At the same time, the setting of the signal amplifying unit 21 may introduce an offset voltage. At this time, by adjusting the equivalent coefficient of the reference adjustment module 10 to compensate the offset voltage, it is helpful to further ensure the accuracy of the comparison result of the data comparison unit 22.

In this embodiment, the signal amplifying unit includes a differential amplifying circuit that is configured to receive the second reference signal 10*a* and the external signal 200, and output the reference amplified signal 10*b* and the external amplified signal 202. Specifically, the differential amplifying circuit includes a third MOS transistor M3 and a fourth MOS transistor M4. The third MOS transistor M3 and the fourth MOS transistor M4 are of the same type and size. A gate of the third MOS transistor M3 is configured to receive the second reference signal 10*a*. A drain of the third MOS transistor M3 is configured to connect to a first load R1. A gate of the fourth MOS transistor M4 is configured to receive the external signal 200. A drain of the fourth MOS transistor M4 is configured to connect to a second load R2. A source of the third MOS transistor M3 and a source of the fourth MOS transistor M4 are connected to a same current source.

It should be noted that, in an ideal situation, the size of the third MOS transistor M3 and the size of the fourth MOS transistor M4 may be the same, but in the actual process preparation environment, due to process non-uniformity, there may be a certain degree of deviation in the sizes of the third MOS transistor M3 and the fourth MOS transistor M4, so that in the case where the voltage value difference between the second reference signal 10*a* and the external signal 200 is zero, the voltage value difference between the reference amplified signal 10*b* and the external amplified signal 202 is not equal to zero. That is, the data comparison unit 22 outputs an erroneous comparison result.

In this embodiment, the resistors with the same resistance value are adopted in the first load R1 and the second load R2. It should be noted that, in an ideal situation, the resistance values of the first load R1 and the second load R2 may be the same. However, in the actual process preparation environment, due to the process non-uniformity, there may be a certain degree of deviation in the resistance values of the first load R1 and the second load R2, so that in the case where the voltage value difference between the second reference signal 10*a* and the external signal 200 is zero, the voltage value difference between the reference amplified signal 10*b* and the external amplified signal 202 is not zero. That is, the data comparison unit 22 outputs an erroneous comparison result.

In this embodiment, during the period of continuously receiving the enable signal, feedback adjustment is performed on the equivalent coefficient of the reference adjustment module based on the magnitude relationship between the voltage values of the external signal and the third reference signal, so as to continuously adjust the voltage value of the second reference signal, and then continuously adjust the voltage value of the third reference signal which is equivalent to the voltage value of the second reference signal and the offset voltage, and finally make the voltage value of the third reference signal equal to the voltage value of the external signal. In other words, by setting the voltage value of the external signal equal to the voltage value of the first reference signal, so that the voltage value of the third reference signal is equal to the voltage value of the first reference signal, so as to compensate the offset voltage through the adjustment of the equivalent coefficient, the accuracy of the comparison signal generated by the comparison circuit is ensured.

Correspondingly, the embodiments of the present disclosure provide a memory including the comparison circuit according to anyone described above. The memory with the above comparison circuit can compensate the offset voltage of the signal receiving module in the ZQ calibration phase, to ensure the accuracy of the comparison signal generated by the comparison circuit in the data writing phase, so as to correctly execute the internal action represented by the external signal according to the right contents of the comparison signal.

Compared with some implementations, the technical solutions provided by the embodiments of the present disclosure have the following advantages:

In the above technical solution, during the period of continuously receiving the enable signal, feedback adjustment is performed on the equivalent coefficient of the reference adjustment module based on the magnitude relationship between the voltage values of the external signal and the third reference signal, so as to continuously adjust the voltage value of the second reference signal, and then continuously adjust the voltage value of the third reference signal which is equivalent to the voltage value of the second reference signal and the offset voltage, and finally make the voltage value of the third reference signal equal to the voltage value of the external signal. In other words, by setting the voltage value of the external signal equal to the voltage value of the first reference signal, so that the voltage value of the third reference signal is equal to the voltage value of the first reference signal, so as to compensate the offset voltage through the adjustment of the equivalent coefficient and ensure the accuracy of the comparison signal generated by the comparison circuit.

In addition, a DRAM controller controls a DRAM circuit to perform ZQ calibration by sending a ZQCL command to the DRAM circuit. ZQ calibration can be performed during the DRAM power-on initialization and reset phases. During the ZQ calibration period, the DRAM circuit does not receive a data signal, and the enable signal is triggered by controlling the ZQCL command, and the duration of controlling enable signal is equal to the duration of the ZQCL command, which can realize the use of the port receiving the data signal to receive the first reference signal while avoiding the occurrence of a conflict between the reception of the first reference signal and the reception of the data signal. That is to say, there is no need to set an additional functional unit to regulate the sequential reception of the first reference signal and the data signal, which is beneficial to simplify the comparison circuit and reduce the complexity of the comparison circuit. In addition, since the ZQ calibration period is used to enable the control module, there is no need to set an additional time period to adjust the equivalent coefficient, the timing sequence is simplified, the initialization time and reset time of the DRAM is shortened, the reading and writing time of the DRAM is maintained, and the operating efficiency of the DRAM is improved.

Further, it should be noted that the modules or units for executing operations of the comparison circuit according to the embodiment of the present disclosure, for example, the reference adjustment module, signal receiving module and the control module can be implemented by hardware such as circuits and processors.

A person of ordinary skill in the art would understand that the above embodiments are specific embodiments for realizing the present disclosure, and in practical applications, various changes in form and details can be made without departing from the spirit and the scope of the present disclosure. Any person skilled in the art can make changes and modifications without departing from the spirit and scope of the present disclosure, and therefore, the protection scope of the present disclosure shall be subject to the scope defined by the claims.

What is claimed is:

1. A comparison circuit, comprising:
a reference adjustment circuit, configured to: receive a first reference signal and output a second reference signal, wherein a voltage value of the second reference signal is equal to a voltage value of the first reference signal multiplied by an equivalent coefficient; and further configured to receive an adjustment signal, and unidirectionally adjust the equivalent coefficient within a preset value interval when the adjustment signal is received;
a signal receiving circuit, configured to receive the second reference signal and an external signal, and output a comparison signal, wherein the voltage value of the second reference signal is a voltage value inputted into the signal receiving circuit, an actual voltage to be compared with a voltage value of the external signal is a voltage value of a third reference signal, the voltage value of the third reference signal is equivalent to the voltage value of the second reference signal and an offset voltage of the signal receiving circuit which comes from an inevitable deviation in the device manufacturing process, and wherein when the voltage value of the external signal is greater than the voltage value of the third reference signal, a first comparison signal is output; and when the voltage value of the external signal is smaller than the voltage value of the third reference signal, a second comparison signal is output; and
a control circuit, configured to: receive an enable signal and the comparison signal; and during a period of continuously receiving the enable signal, output the adjustment signal when one of the first comparison signal or the second comparison signal is received, and terminate the output of the adjustment signal when the received comparison signal jumps from one of the first comparison signal or the second comparison signal to the other,
wherein the reference adjustment circuit comprises an operational amplifier and a plurality of series resistors, the operational amplifier has a non-inverting input terminal, an inverting input terminal and an output terminal, the non-inverting input terminal is configured to receive the first reference signal, a first number of resistors are connected in series between the inverting input terminal and the output terminal, and a second number of resistors are connected in series between the inverting input terminal and a ground terminal;
the operation of unidirectionally adjusting the equivalent coefficient within the preset value interval comprises: controlling an output terminal of the reference adjustment circuit to be connected to a far ground terminal of a resistor, in an order from the output terminal to the ground terminal, or in an order from the ground terminal to the output terminal,
wherein the signal receiving circuit comprises:
a signal amplifying sub-circuit, having a first input terminal that is configured to receive the external signal, a second input terminal that is configured to receive the second reference signal, a first output terminal that is configured to output a reference amplified signal, and a second output terminal that is configured to output an external amplified signal, wherein an absolute value of a difference between a voltage value of the reference amplified signal and a voltage value of the external amplified signal is greater than an absolute value of a difference between the voltage value of the second reference signal and the voltage value of the external signal; and
a data comparison sub-circuit, wherein a non-inverting input terminal of the data comparison sub-circuit is configured to receive the reference amplified signal, and a inverting input terminal of data comparison sub-circuit is configured to receive the external amplified signal, and the data comparison sub-circuit is configured to output the first comparison signal when the voltage value of the external amplified signal is greater than the voltage value of the reference amplified signal, and output the second comparison signal when the voltage value of the external amplified signal is smaller than the voltage value of the reference amplified signal.

2. The comparison circuit according to claim 1, wherein the external signal comprises the first reference signal or a data signal, and the data signal is taken as the external signal when the enable signal is not received;
the comparison circuit further comprises:
a signal input circuit, connected to an input terminal of the signal receiving circuit, configured to receive the enable signal and the first reference signal, wherein the first reference signal is taken as the external signal during the period of continuously receiving the enable signal.

3. The comparison circuit according to claim 2, wherein the signal input circuit comprises a first MOS transistor, a drain of the first MOS transistor is configured to receive the first reference signal, a gate of the first MOS transistor is configured to receive the enable signal, and a source of the first MOS transistor is connected to a first input terminal of the signal receiving circuit, wherein the first input terminal of the signal receiving circuit is further configured to receive the data signal, and a second input terminal of the signal receiving circuit is configured to receive the second reference signal.

4. The comparison circuit according to claim 2, wherein an enable terminal of the signal input circuit that is configured to receive the enable signal is connected to an enable terminal of the control circuit that is configured to receive the enable signal.

5. The comparison circuit according to claim 1, wherein the reference adjustment circuit further comprises:
a plurality of switches, located between a far ground terminal of each of the resistors and the output terminal of the reference adjustment circuit, wherein the switches located between far ground terminals of different resistors and the output terminal of the reference adjustment-circuit are different;
the operation of controlling the output terminal of the reference adjustment circuit to be connected to the far ground terminal of the resistor comprises: controlling one of the plurality of switches to be turned on.

6. The comparison circuit according to claim 5, wherein the adjustment signal is a trigger signal, and the operation of controlling one of the plurality of switches to be turned on comprises:
controlling one of the plurality of switches to be turned on according to a preset unidirectional adjustment order.

7. The comparison circuit according to claim 1, wherein the control circuit comprises:
- a control sub-circuit, configured to: receive the comparison signal; when a voltage value of a current comparison signal is the same as a voltage value of a previous comparison signal, adjust parameter information comprised in the adjustment signal in the preset unidirectional adjustment order, and output the adjustment signal after adjusting the parameter information; and when the voltage value of the current comparison signal is different from the voltage value of the previous comparison signal, store the parameter information comprised in the adjustment signal, wherein the reference adjustment circuit is further configured to take the parameter information comprised in the adjustment signal as the equivalent coefficient;
- an enabling sub-circuit, configured to receive the enable signal, and enable the control sub-circuit during the period of continuously receiving the enable signal.

8. The comparison circuit according to claim 7, wherein the enabling sub-circuit comprises a second MOS transistor, a drain of the second MOS transistor is connected to an output terminal of the signal receiving circuit, a source of the second MOS transistor is connected to an input terminal of the control sub-circuit, and a gate of the second MOS transistor is configured to receive the enable signal.

9. The comparison circuit according to claim 1, wherein the signal amplifying sub-circuit comprises a differential amplifying circuit configured to receive the second reference signal and the external signal, and output the reference amplified signal and the external amplified signal.

10. The comparison circuit according to claim 9, wherein the differential amplifying circuit comprises a third MOS transistor and a fourth MOS transistor, both of the third MOS transistor and the fourth MOS transistor are of the same type and size;
- wherein a gate of the third MOS transistor is configured to receive the second reference signal, a drain of the third MOS transistor is configured to connect to a first load, a gate of the fourth MOS transistor is configured to receive the external signal, a drain of the fourth MOS transistor is configured to connect to a second load, and a source of the third MOS transistor and a source of the fourth MOS transistor are connected to a same current source.

11. The comparison circuit according to claim 10, wherein the first load and the second load are resistors with a same resistance value.

12. The comparison circuit according to claim 1, wherein the enable signal is triggered by a ZQCL command in a DRAM circuit, and a duration of the enable signal is equal to a duration of the ZQCL command.

13. A memory comprising a comparison circuit, wherein the comparison circuit comprises:
- a reference adjustment circuit, configured to: receive a first reference signal and output a second reference signal, wherein a voltage value of the second reference signal is equal to a voltage value of the first reference signal multiplied by an equivalent coefficient; and further configured to receive an adjustment signal, and unidirectionally adjust the equivalent coefficient within a preset value interval when the adjustment signal is received;
- a signal receiving circuit, configured to receive the second reference signal and an external signal, and output a comparison signal, wherein the voltage value of the second reference signal is a voltage value inputted into the signal receiving circuit, an actual voltage to be compared with a voltage value of the external signal is a voltage value of a third reference signal, the voltage value of the third reference signal is equivalent to the voltage value of the second reference signal and an offset voltage of the signal receiving circuit which comes from an inevitable deviation in the device manufacturing process, and wherein when the voltage value of the external signal is greater than the voltage value of the third reference signal, a first comparison signal is output; and when the voltage value of the external signal is smaller than the voltage value of the third reference signal, a second comparison signal is output; and
- a control circuit, configured to: receive an enable signal and the comparison signal; and during a period of continuously receiving the enable signal, output the adjustment signal when one of the first comparison signal or the second comparison signal is received, and terminate the output of the adjustment signal when the received comparison signal jumps from one of the first comparison signal or the second comparison signal to the other, wherein the reference adjustment circuit comprises an operational amplifier and a plurality of series resistors, the operational amplifier has a non-inverting input terminal, an inverting input terminal and an output terminal, the non-inverting input terminal is configured to receive the first reference signal, a first number of resistors are connected in series between the inverting input terminal and the output terminal, and a second number of resistors are connected in series between the inverting input terminal and a ground terminal;

the operation of unidirectionally adjusting the equivalent coefficient within the preset value interval comprises: controlling an output terminal of the reference adjustment circuit to be connected to a far ground terminal of a resistor, in an order from the output terminal to the ground terminal, or in an order from the ground terminal to the output terminal, wherein the signal receiving circuit comprises:
- a signal amplifying sub-circuit, having a first input terminal that is configured to receive the external signal, a second input terminal that is configured to receive the second reference signal, a first output terminal that is configured to output a reference amplified signal, and a second output terminal that is configured to output an external amplified signal, wherein an absolute value of a difference between a voltage value of the reference amplified signal and a voltage value of the external amplified signal is greater than an absolute value of a difference between the voltage value of the second reference signal and the voltage value of the external signal; and
- a data comparison sub-circuit, wherein a non-inverting input terminal of the data comparison sub-circuit is configured to receive the reference amplified signal, and a inverting input terminal of data comparison sub-circuit is configured to receive the external amplified signal, and the data comparison sub-circuit is configured to output the first comparison signal when the voltage value of the external amplified signal is greater than the voltage value of the reference amplified signal, and output the second comparison signal when the voltage value of the external amplified signal is smaller than the voltage value of the reference amplified signal.

14. The memory according to claim 13, wherein the external signal comprises the first reference signal or a data signal, and the data signal is taken as the external signal when the enable signal is not received;

the comparison circuit further comprises:

a signal input circuit, connected to an input terminal of the signal receiving circuit, configured to receive the enable signal and the first reference signal, wherein the first reference signal is taken as the external signal during the period of continuously receiving the enable signal.

15. The memory according to claim 14, wherein the signal input circuit comprises a first MOS transistor, a drain of the first MOS transistor is configured to receive the first reference signal, a gate of the first MOS transistor is configured to receive the enable signal, and a source of the first MOS transistor is connected to a first input terminal of the signal receiving circuit, wherein the first input terminal of the signal receiving circuit is further configured to receive the data signal, and a second input terminal of the signal receiving circuit is configured to receive the second reference signal.

16. The memory according to claim 14, wherein an enable terminal of the signal input circuit that is configured to receive the enable signal is connected to an enable terminal of the control circuit that is configured to receive the enable signal.

17. The memory according to claim 13, wherein the reference adjustment circuit further comprises:

a plurality of switches, located between a far ground terminal of each of the resistors and the output terminal of the reference adjustment circuit, wherein the switches located between far ground terminals of different resistors and the output terminal of the reference adjustment circuit are different;

the operation of controlling the output terminal of the reference adjustment circuit to be connected to the far ground terminal of the resistor comprises: controlling one of the plurality of switches to be turned on.

* * * * *